United States Patent
Akasaka et al.

(10) Patent No.: US 6,920,166 B2
(45) Date of Patent: Jul. 19, 2005

(54) THIN FILM DEPOSITION METHOD OF NITRIDE SEMICONDUCTOR AND NITRIDE SEMICONDUCTOR LIGHT EMITTING DEVICE

(75) Inventors: Tetsuya Akasaka, Atsugi (JP); Seigo Ando, Sagamihara (JP); Toshio Nishida, Atsugi (JP); Naoki Kobayashi, Atsugi (JP); Tadashi Saitoh, Hadano (JP)

(73) Assignee: Nippon Telegraph & Telephone Corporation, Tokyo (JP)

( * ) Notice: Subject to any disclaimer, the term of this patent is extended or adjusted under 35 U.S.C. 154(b) by 172 days.

(21) Appl. No.: 10/390,358

(22) Filed: Mar. 17, 2003

(65) Prior Publication Data

US 2003/0179793 A1 Sep. 25, 2003

(30) Foreign Application Priority Data

Mar. 19, 2002 (JP) ........................... 2002-077058

(51) Int. Cl.$^7$ ................................. H01S 5/00
(52) U.S. Cl. .............................. 372/45; 372/43
(58) Field of Search .................... 372/39–45

(56) References Cited

U.S. PATENT DOCUMENTS

| | | | | |
|---|---|---|---|---|
| 5,727,008 A | * | 3/1998 | Koga ........................ | 372/43 |
| 5,864,171 A | * | 1/1999 | Yamamoto et al. ......... | 257/628 |
| 6,051,847 A | * | 4/2000 | Oku et al. ................. | 257/94 |
| 6,503,788 B1 | * | 1/2003 | Yamamoto ................. | 438/231 |
| 6,680,959 B2 | * | 1/2004 | Tanabe et al. ............. | 372/45 |
| 2002/0003823 A1 | * | 1/2002 | Yoshida et al. ............ | 372/46 |

FOREIGN PATENT DOCUMENTS

| | | |
|---|---|---|
| JP | 09036426 A | 2/1997 |
| JP | 09246666 A | 9/1997 |
| JP | 10256601 A | 9/1998 |
| JP | 11233886 A | 8/1999 |

OTHER PUBLICATIONS

Shuji Nakamura, *III–V Nitride Based Light–Emitting Devices*, Solid State Communications, vol. 102, No. 2–3, 1997, pp. 237–248.

Isamu Akasaki et al., *Crystal Growth and Conductivity Control of Group III Nitride Semiconductors and Their Application to Short Wavelenght Light Emitters*, Jpn. J. Appl. Phys. Part 1, No. 9A, vol. 36, 1997, pp. 5393–5408.

Shuji Nakamura et al., *InGaN–Based Multi–Quantum–Well–Structure Laser Diodes*, Jpn. J. Appl. Phys., Part 2, No. 1B, vol. 35, 1996, pp. L74–L76.

T. Akasaka et al., *Current–confining Structure in InGaN Hexagonal Microfacet Lasers by Selective Incorporation of Mg During Selective–area MOVPE*, 11$^{th}$ International Conference on Metalorganic Vapour Phase Epitaxy, (Wed–F2), Berlin, Jun. 3–7, 2002.

* cited by examiner

*Primary Examiner*—Minsun Oh Harvey
*Assistant Examiner*—Phillip Nguyen
(74) *Attorney, Agent, or Firm*—Workman Nydegger

(57) ABSTRACT

A masking material 13, which includes stripe-like openings 12 parallel to the [1-100] direction of a nitride semiconductor thin film, is formed on a substrate. Nitride semiconductor thin films 11 doped with Mg are grown on the openings 12 by selective-area growth. The nitride semiconductor thin films 11 are composed of a portion 14 formed as a result of the growth in the direction perpendicular to a (0001) principal plane, and a portion 15 formed as a result of the growth of {11-2x} facets (x=0, 1, 2). The Mg concentration of the portion 15 is made lower than that of the portion 14.

20 Claims, 10 Drawing Sheets

THIN FILM DEPOSITION METHOD OF NITRIDE SEMICONDUCTOR AND NITRIDE SEMICONDUCTOR LIGHT EMITTING DEVICE

This application claims priority from Japanese Patent Application No. 2002-077058 filed Mar. 19, 2002, which is incorporated hereinto by reference.

BACKGROUND OF THE INVENTION

1. Field of the Invention

The present invention relates to a nitride semiconductor light emitting device with low power consumption and/or a low laser oscillation threshold value, which reduces the contact resistance of a p-type nitride semiconductor with an electrode and the loss of injected carriers due to nonradiative surface recombination, and to a thin film deposition method of the nitride semiconductor for implementing such a device.

2. Description of the Related Art

A nitride semiconductor is a compound of nitrogen with at least one of III group elements B, Al, Ga and In, and includes BN, GaN, AlGaN, InGaN, AlInGaN and the like. Recently, much research and development have been done on such nitride semiconductors as light-emitting materials in short wavelength band ranging from visible to near-ultraviolet.

Light emitting diodes using nitride semiconductor thin films can emit light from orange to ultraviolet. Such light emitting diodes are described by S. Nakamura (Solid State Communications, Vol. 102, No. 2–3, 1997, pp. 237–248).

On the other hand, semiconductor lasers using a nitride semiconductor (called "nitride semiconductor lasers" from now on) can achieve lasing at room temperature by continuous wave operation at oscillation wavelength from about 450 nm to 370 nm. Such nitride semiconductor lasers are described by I. Akasaki et al. (Jpn. J. Appl. Phys. Part 2, vol. 36, pp. 5393, 1997). In addition, nitride semiconductor lasers with mesa stripes have been formed by dry etching. Such nitride semiconductor lasers are reported by S. Nakamura et al. (Jpn. J. Appl. Phys. Part 2, vol. 35, pp. L74, 1996).

Generally, Mg is used as a dopant to implement a p-type nitride semiconductor. However, as for GaN, the most prevalently used nitride semiconductor crystal today, the activation energy of the Mg in the GaN crystal is about 200 meV, which is much greater than the thermal energy at room temperature. Accordingly, the hole concentration of only about $10^{17}$ cm$^{-3}$ can be achieved. In addition, since the GaN crystal has a large band gap, there is no appropriate metallic material with a work function enabling good ohmic contact. For these reasons, the contact resistance of the p-type GaN (p-GaN) with an electrode is order-of-magnitude greater than that of the other semiconductors, which presents a problem of preventing characteristic improvement of the light emitting devices using the nitride semiconductors.

Furthermore, the nitride semiconductor lasers with the conventional structures expose the side facets of their active layers. Thus, the carriers injected from an electrode are easy to recombine nonradiatively at the side facets of the active layers. As a result, they have a problem of increasing the laser oscillation threshold value and operation power consumption.

SUMMARY OF THE INVENTION

The present invention provides a technique to reduce the adverse effect the contact resistance between the p-type nitride semiconductor and electrode, which causes a problem in the light emitting devices such as light emitting diodes and semiconductor lasers using nitride semiconductors, can have on the device characteristics, and a technique to suppress the loss of the internal quantum efficiency of the injected carriers due to the nonradiative surface recombination, which causes a problem in nitride semiconductor lasers. An object of the present invention is to provide a nitride semiconductor light emitting device and a thin film deposition method for the device capable of solving the foregoing two problems simultaneously.

According to a first aspect of the present invention, there is provided a thin film deposition method of a nitride semiconductor of forming thin films on a substrate by selective-area growth of a nitride semiconductor whose principal orientation plane is a (0001) plane, the thin film deposition method comprising the steps of: forming on a principal orientation plane of the substrate a masking material including stripe-like openings parallel to a [1-100] direction of a nitride semiconductor to be grown by selective-area growth, or polygon-like openings whose side is parallel to a [1-100] direction of a nitride semiconductor thin film to be grown by selective-area growth, to expose part of the principal orientation plane of the substrate; growing nitride semiconductor thin films on the opening region by selective-area growth by vapor phase growth using a gas containing metallic magnesium or magnesium compound, the nitride semiconductor thin films (A+B) being composed of a first nitride semiconductor crystal portion (A) formed as a result of growth in the direction perpendicular to the (0001) principal plane and a second nitride semiconductor crystal portion (B) formed as a result of growth of {11–2x} (x=0, 1, 2) facets; and making Mg concentration of the second nitride semiconductor crystal portion (B) lower than that of the first nitride semiconductor crystal portion (A).

The nitride semiconductor thin films (A+B) formed in this method are composed of the p-type low resistance portion (A) formed as a result of the growth of the (0001) plane and the high resistance portion (B) formed as a result of the growth of the {11–2x} facets (x=0, 1, 2). Thus, a p-type contact layer is obtained which operates as a current confinement layer of the nitride semiconductor light emitting device. This makes it possible to increase the area of a p-type electrode as compared with that of the conventional devices, and to reduce the loss of power due to contact resistance.

In addition, when forming in advance on a principal orientation plane of the substrate a stripe-like nitride semiconductor base layer that is parallel to a [1-100] direction of a nitride semiconductor to be grown by selective-area growth and has a (0001) plane as a principal orientation plane, or a polygon-like nitride semiconductor base layer whose side is parallel to a [1-100] direction of nitride semiconductors to be grown by selective-area growth and which has a (0001) plane as a principal orientation plane; growing nitride semiconductor thin films on the principal orientation plane and side facets of the nitride semiconductor base layer by selective-area growth by vapor phase growth using a gas containing metallic magnesium or magnesium compound, the nitride semiconductor thin films (A+B) being composed of a first nitride semiconductor crystal portion (A) formed as a result of growth in the direction perpendicular to the (0001) principal plane and a second nitride semiconductor crystal portion (B) formed as a result of growth of {11–2x} (x=0, 1, 2) facets; and making Mg concentration of the second nitride semiconductor crystal portion (B) lower than that of the first nitride semiconductor crystal portion (A), the nitride semiconductor thin films (A+B) formed in this method are composed of the p-type low resistance portion (A) formed as a result of the growth of the (0001) plane and the high resistance portion (B) formed as a result of the {11-2x} facets (x=0, 1, 2). Thus, a p-type contact layer is obtained which operates as a current confinement layer of the nitride semiconductor light emitting device. This makes it possible to increase the area of a p-type electrode as compared with that of the conventional devices, and to reduce the loss of power due to contact resistance. In addition, since the nitride semiconductor thin films are usable for the cladding layer of an index-guided nitride semiconductor laser, the nonradiative surface recombination of injected carriers can be suppressed, thereby reducing the oscillation threshold value of the laser.

According to a second aspect of the present invention, there is provided a thin film deposition method of a nitride semiconductor of forming thin films on a substrate by selective-area growth of a nitride semiconductor whose principal orientation plane is a (0001) plane, the thin film deposition method comprising the steps of: forming on a principal orientation plane of the substrate a masking material including stripe-like openings parallel to a [11-20] direction of a nitride semiconductor to be grown by selective-area growth, or polygon-like openings whose side is parallel to a [11-20] direction of a nitride semiconductor thin film to be grown by selective-area growth, to expose part of the principal orientation plane of the substrate; growing nitride semiconductor thin films on the opening region by selective-area growth by vapor phase growth using a gas containing metallic magnesium or magnesium compound, the nitride semiconductor thin films (A'+B') being composed of a first nitride semiconductor crystal portion (A') formed as a result of growth in the direction perpendicular to the (0001) principal plane and a second nitride semiconductor crystal portion (B') formed as a result of growth of {1-10x} (x=0, 1) facets; and making Mg concentration of the second nitride semiconductor crystal portion (B') lower than that of the first nitride semiconductor crystal portion (A').

Alternatively, the thin film deposition method may comprise the steps of: forming on a principal orientation plane of the substrate a stripe-like nitride semiconductor base layer that is parallel to a [11-20] direction of a nitride semiconductor to be grown by selective-area growth and has a (0001) plane as a principal orientation plane, or a polygon-like nitride semiconductor base layer whose side is parallel to a [11-20] direction of a nitride semiconductor to be grown by selective-area growth and which has a (0001) plane as a principal orientation plane; growing nitride semiconductor thin films on the principal orientation plane and side facets of the nitride semiconductor base layer by selective-area growth by vapor phase growth using a gas containing metallic magnesium or magnesium compound, the nitride semiconductor thin films (A'+B') being composed of a first nitride semiconductor crystal portion (A') formed as a result of growth in the direction perpendicular to the (0001) principal plane and a second nitride semiconductor crystal portion (B') formed as a result of growth of {1-10x} (x=0, 1) facets; and making Mg concentration of the second nitride semiconductor, crystal portion (B') lower than that of the first nitride semiconductor crystal portion (A').

The second aspect of the invention can also achieve the same advantages as the first aspect of the invention.

The above and other objects, effects, features and advantages of the present invention will become more apparent from the following description of embodiments thereof taken in conjunction with the accompanying drawings.

DETAILED DESCRIPTION OF PREFERRED EMBODIMENTS

The embodiments of the present invention will now be described with reference to the accompanying drawings.

Figure 1A:
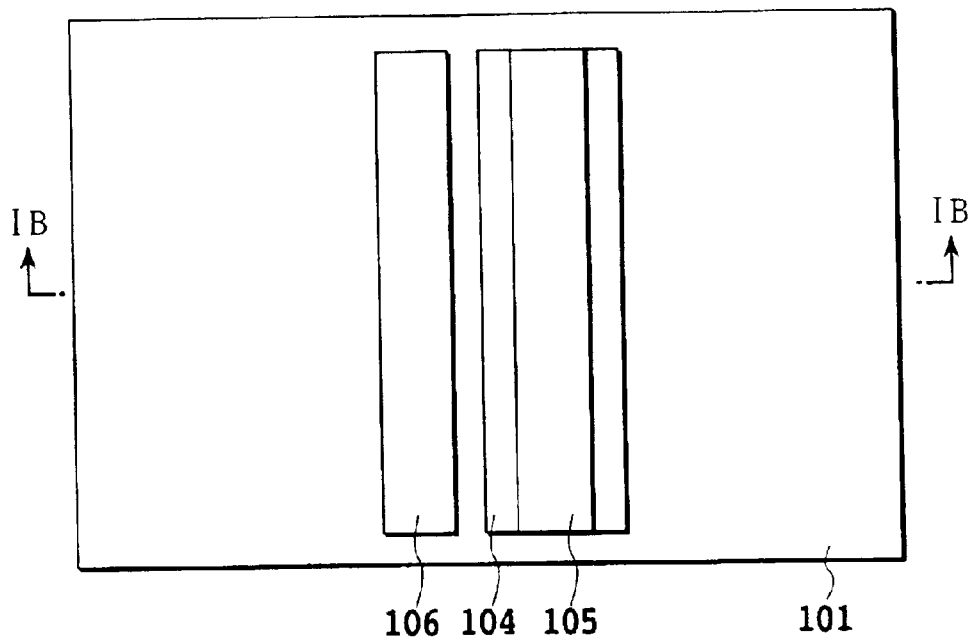
FIG. 1A is a plan view showing a structure of a conventional nitride semiconductor laser.
Figure 1B:
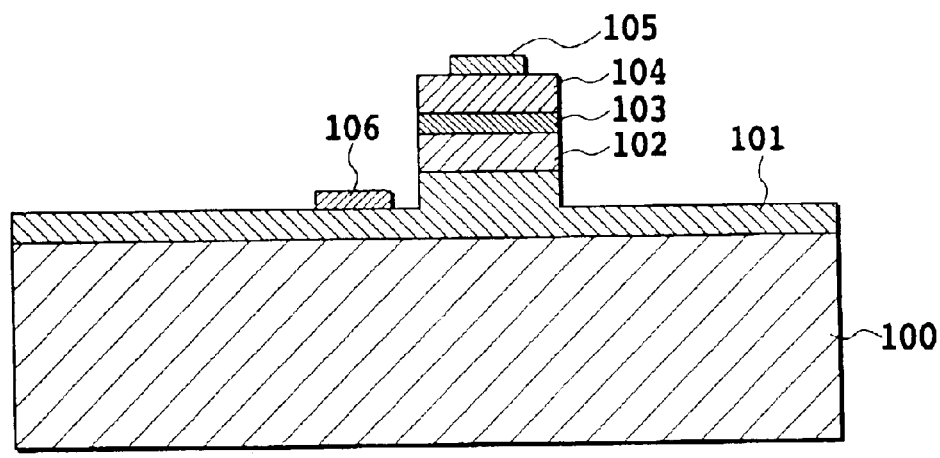
FIG. 1B is a cross-sectional view showing a structure of the conventional nitride semiconductor laser.

FIGS. 1A and 1B are views illustrating a conventional structure of a nitride semiconductor with a mesa stripe formed by dry etching: FIG. 1A is a plan view of the nitride semiconductor laser; and FIG. 1B is a cross-sectional view taken along the line IB—IB of FIG. 1A.

The nitride semiconductor laser comprises on an n-type GaN (n-GaN) layer 101 formed on a sapphire substrate 100, a stack of an n-type nitride semiconductor multilayer 102, InGaN multi-quantum-well (MQW) active layer 103 and a p-type nitride semiconductor multilayer 104, which form thin films with laser multilayer structure. Then, it is shaped to a mesa structure by reactive ion etching, followed by forming a p-type electrode 105 and an n-type electrode 106, thereby forming a laser structure.

The conventional laser structure shown in these figures is characterized by very close optical confinement in a horizontal direction (a direction parallel to the sapphire substrate 100 and perpendicular to the cavity) because the mesa reaches a buffer layer region near the interface between the sapphire substrate 100 and n-GaN layer 101. However, since the side facets of the InGaN-MQW layer 103 constituting the active layer are exposed, carriers injected from the electrodes 105 and 106 to the InGaN-MQW layer 103 are easy to make nonradiative surface recombination at the side facets of the InGaN-MQW layer 103, resulting in an increase of the laser oscillation threshold value and power consumption during the operation.

Figure 2A:
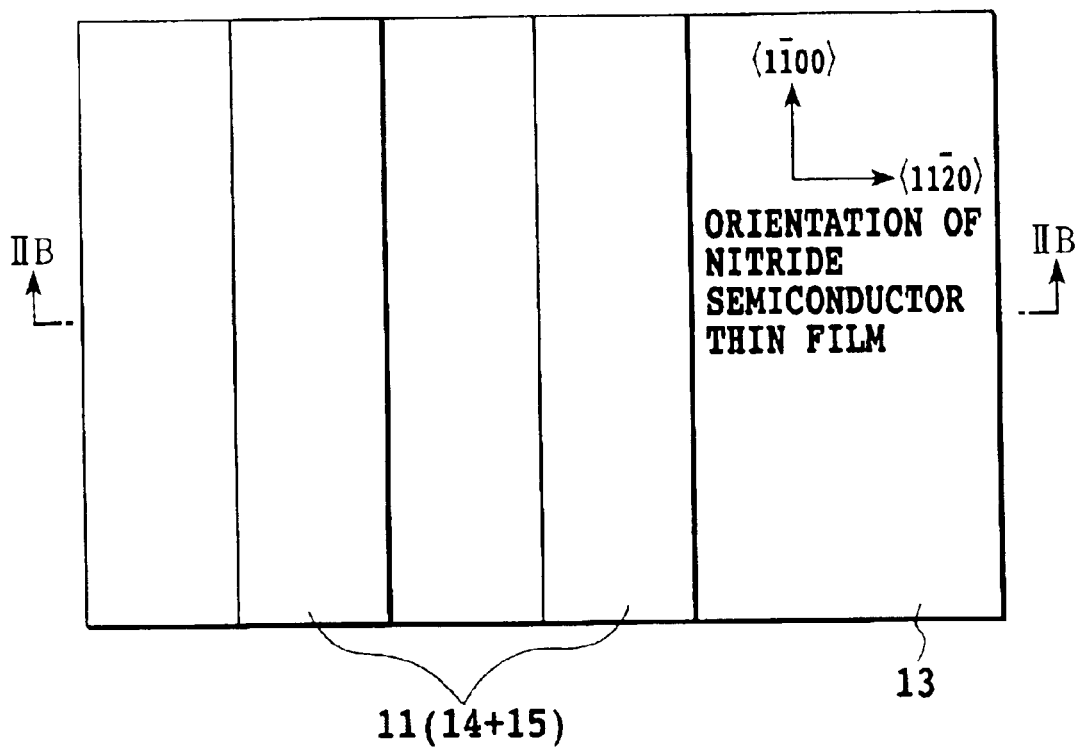
FIG. 2A is a plan view illustrating a process for solving the problems by the present invention, a plan view showing a state in which Mg-doped nitride semiconductor thin films are formed on a substrate by selective-area growth with its side surfaces composed of {11-2x} facets (x=0, 1, 2)
Figure 2B:
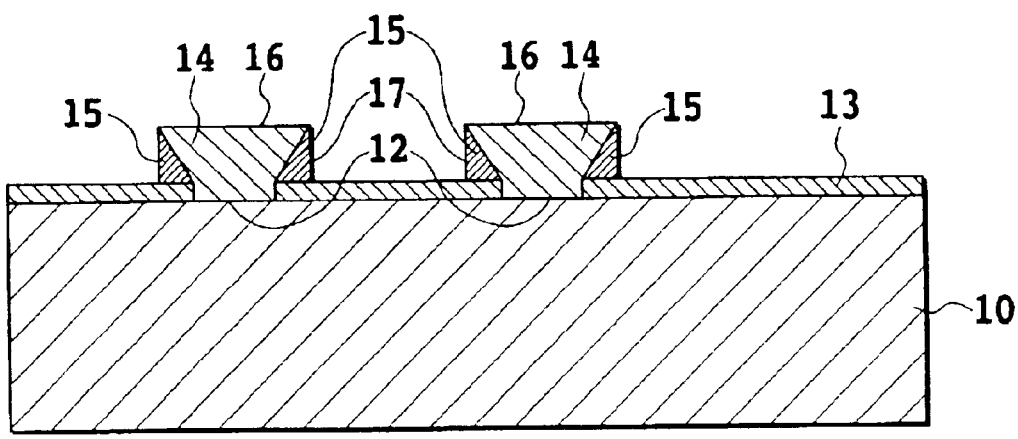
FIG. 2B is a cross-sectional view taken along the line IIB—IIB of FIG. 2A.

FIGS. 2A and 2B are views illustrating a first example of a fabrication process of the nitride semiconductor light emitting device in accordance with the present invention for solving such problems. FIG. 2A is a plan view showing the nitride semiconductor light emitting device at a step of the first example of the fabrication process; and FIG. 2B shows a cross-section along the line IIB—IIB of FIG. 2A.

The nitride semiconductor light emitting device is formed by growing nitride semiconductor thin films having the (0001) plane as the principal plane on a substrate by selective-area growth. As the substrate, it is possible to use nitride semiconductors, sapphire, silicon carbide (SiC), silicon, gallium arsenide and the like.

First, considering the relationship between the crystal orientation of the substrate 10 and that of the nitride semiconductor thin films to be formed by the selective-area growth, a masking material 13 was formed on the principal plane of the substrate 10. The masking material 13 has stripe-like openings 12 parallel to the [1-100] direction of the nitride semiconductor thin films. Subsequently, a nitride semiconductor thin films 11 were grown in the openings 12 of the masking material 13 formed on the principal plane of the substrate 10 by the selective-area growth using growth gas including metallic magnesium or magnesium compound as one of the materials with doping the magnesium by the vapor phase growth such as the metalorganic vapor phase epitaxy (MOVPE). In this case, the crystallographical relationship between the crystal planes, and the crystal growth conditions are selected appropriately such that the side surfaces of the nitride semiconductor thin films 11 become {11-2x} facets (x=0, 1, 2).

Incidentally, throughout the present specification, the Miller indices $\{hk\bar{i}l\}$ (h, k, i bar, l) are represented as {hk-il} (h, k, minus i, l).

Although several methods are possible as a selecting method of the facet orientation, such a method is effective that varies the shape of the openings 12 depending on the facets to be formed. For example, making the angle between two adjacent straight-line sides of the openings 12 less than 180 degrees enables the {11-20} facets to be formed at the side facets of the nitride semiconductor thin films near the straight-line sides of the openings 12. On the other hand, making at least one of the angles between the two adjacent straight-line sides of the openings 12 in the masking material 13 greater than 180 degrees enables the {11-2x} (x=1 or 2) facets to be formed on the side facets of the nitride semiconductor thin films near the straight-line sides of the openings 12.

Generally, in the selective-area growth of the nitride semiconductor crystal with a wurtzite crystal structure, when the crystal growth rate is rather slow, there is a tendency to form vertical {11-20} facets. In contrast, when the crystal growth rate exceeds a particular value, there arises a tendency to form {11-22} oblique facets. Thus, at least one of the angles between the two adjacent straight-line sides of the openings 12 in the masking material 13 is greater than 180 degrees, the diffused amount (supplied amount) of the materials increases near that bending portion via the vapor and the surface of the masking material, thereby increasing the crystal growth rate compared with the case without such a bending portion. As a result, the facets with different surface orientations are formed according to the shapes of the openings 12 in the masking material 13.

The nitride semiconductor thin films 11 thus formed consist of a portion 14 (first nitride semiconductor crystal portion) formed as a result of the growth of the (0001) plane, and a portion 15 (second nitride semiconductor crystal portion) formed as a result of the growth of the {11-2x} facets. As for these crystal surfaces, the sticking probability or acquisition efficiency of the dopant Mg varies depending on the difference in their surface structures.

Under the crystal growth conditions of the typical MOVPE the present invention employs, the Mg acquisition efficiency of the (0001) plane is greater than that of the {11-2x} facets. Accordingly, the Mg content in the nitride semiconductor thin films 11 is much greater in the portion 14 formed as a result of the growth of the (0001) plane than in the portion 15 formed as a result of the growth of the {11-2x} facets. Consequently, the portion 14 formed as a result of the growth of the (0001) plane has a lower bulk resistance than the portion 15 formed as a result of the growth of the {11-2x} facets.

A p-type electrode was formed on the (0001) plane of the nitride semiconductor thin films 11 thus formed to be used as the p-type contact layer of the nitride semiconductor light emitting device. This enables the current flowing through the nitride semiconductor thin films 11 to selectively flow through the portion 14 formed as a result of the growth of the (0001) plane with a low bulk resistance. Thus, the portion 15 formed as a result of the growth of the {11-2x} facets with a high bulk resistance serves as a current confinement layer for confining the current. Accordingly, the current confinement layer can increase the area of the p-type electrode than that of the conventional nitride semiconductor light emitting device. This enables the contact resistance between the nitride semiconductor and the p-type electrode to be suppressed to a small value, thereby making it possible to reduce the power consumption involved in the operation of the light emitting device.

Figure 3A:
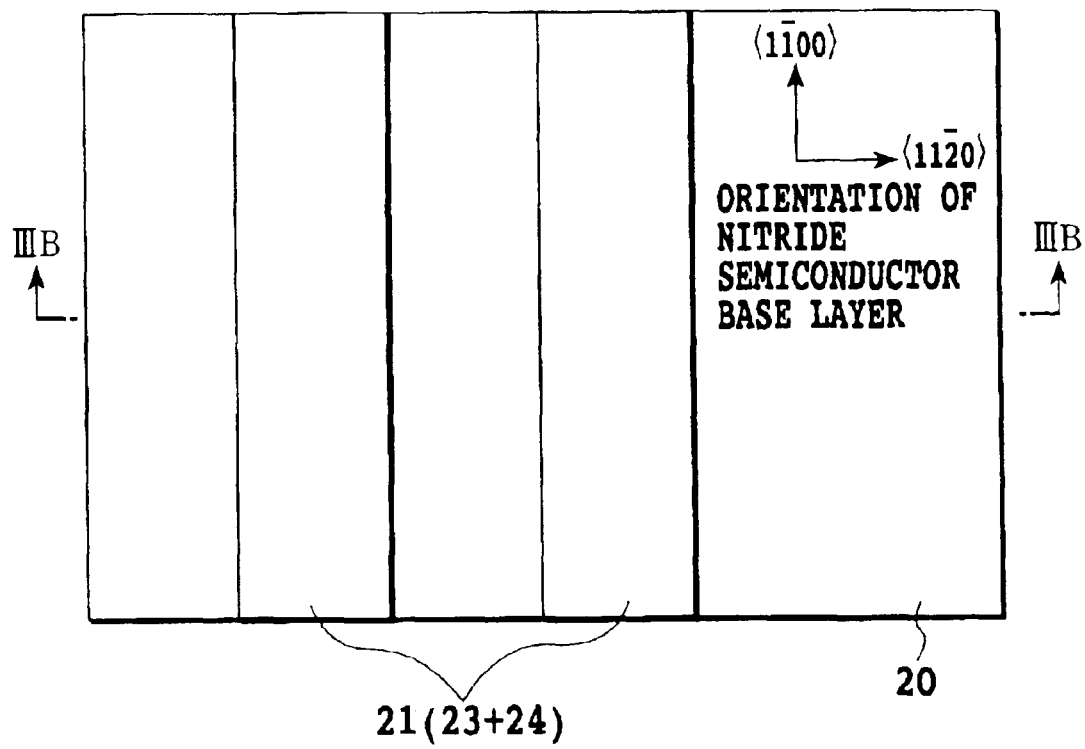
FIG. 3A is a plan view illustrating a process for solving the problems by the present invention, a plan view showing a state in which Mg-doped nitride semiconductor thin films are formed on a principal plane and etched side facets of a nitride semiconductor base layer formed on a substrate by selective-area growth with its side surfaces composed of {11-2x} facets (x=0, 1, 2)
Figure 3B:
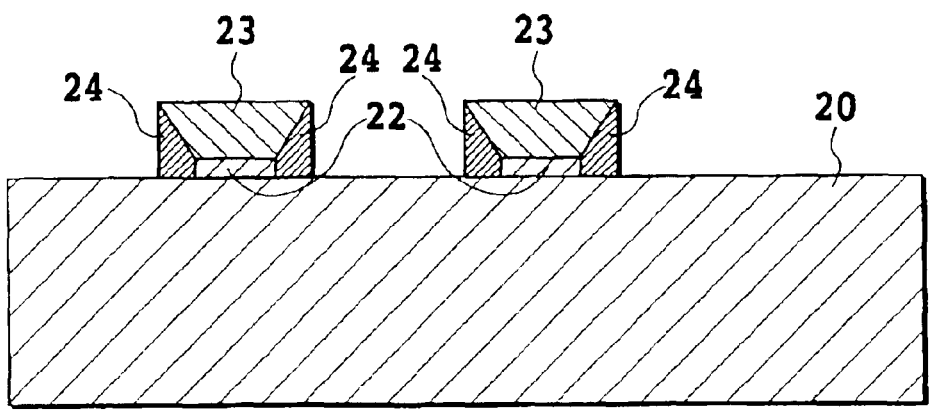
FIG. 3B is a cross-sectional view taken along the line IIIB—IIIB of FIG. 3A.

FIGS. 3A and 3B are views illustrating a second example of a fabrication process of the nitride semiconductor light emitting device in accordance with the present invention: FIG. 3A is a plan view showing the nitride semiconductor light emitting device at a step of the fabrication process; and FIG. 3B shows a cross-section along the line IIIB—IIIB of FIG. 3A.

The nitride semiconductor light emitting device is constructed by partially forming on a substrate a nitride semiconductor thin films (nitride semiconductor base layer) in advance which have the (0001) plane as the principal plane and serve as a base layer, followed by forming a nitride semiconductor thin films on the nitride semiconductor base layer by the selective-area growth. As the substrate, it is possible to use nitride semiconductors, sapphire, silicon carbide (SiC), silicon, gallium arsenide and the like.

First, by etching the nitride semiconductor base layer, which was formed on the substrate 20 in advance, into stripes parallel to the [1-100] direction, a stripe-like nitride semiconductor thin film 22 was formed.

Subsequently, while doping Mg by the vapor phase growth such as MOVPE using growth gas including metallic magnesium or magnesium compound as one of the materials, the nitride semiconductor thin films 21 were grown by the selective-area growth on the (0001) plane which was the principal plane of the stripe-like nitride semiconductor thin film 22 and on its etched side facets. In this case, the crystallographical relationship between the crystal planes, and the crystal growth conditions were selected appropriately such that the side surfaces of the nitride semiconductor thin films 21 became {11-2x} facets (x=0, 1, 2).

The nitride semiconductor thin films 21 consist of a portion 23 formed as a result of the growth of the (0001) plane, and a portion 24 formed as a result of the growth of the {11-2x} facets. For the reason described above, the Mg content in the nitride semiconductor thin films 21 is much greater in the portion 23 formed as a result of the growth of the (0001) plane than in the portion 24 formed as a result of the growth of the {11-2x} facets. Consequently, the portion 23 formed as a result of the growth of the (0001) plane has a lower bulk resistance than the portion 24 formed as a result of the growth of the {11-2x} facets.

Then, using a p-type electrode, which was formed on the (0001) plane on the nitride semiconductor thin films 21 thus formed, as the current confinement layer of the nitride semiconductor light emitting device can increase the area of the p-type electrode than that of the conventional nitride semiconductor light emitting device. This makes it possible to suppress the contact resistance between the nitride semiconductor and the p-type electrode, thereby being able to reduce the power consumption in the operation of the light emitting device. In addition, the nitride semiconductor layer 21 can be used as the cladding layer of an index-guided nitride laser without change.

The nitride semiconductor light emitting devices in accordance with the present invention and their fabrication methods are not limited to those described in connection with FIGS. 2A and 2B and FIGS. 3A and 3B. There are some variations.

For example, the same effects can be achieved by setting the orientation of the foregoing stripe-like openings 12 of the masking material, or the orientation of the stripe-like nitride semiconductor base layer (stripe-like nitride semiconductor thin film 22) in the [11-20] direction instead of the [1-100] direction. The nitride semiconductor thin films formed in this case have the side surfaces consisting of the {1-10x} facets (x=0, 1). In addition, the Mg content of the portion formed as a result of the growth of the facets is lower than that of the portion formed as a result of the growth of the (0001) plane.

Furthermore, the shape of the openings 12 in the masking material or of the nitride semiconductor base layer can be a polygon with its arbitrary side having [1-100] or [11-20] direction instead of stripe, achieving the same effect.

As described above, according to the fabrication method of the nitride semiconductor light emitting device in accordance with the present invention, the spatial distribution of the Mg content in the nitride semiconductor thin films can be designed freely by forming in a specified shape or direction the openings of the masking material formed on the principal plane of the crystal substrate and the nitride semiconductor base layer used as a seed crystal, when carrying out the selective-area growth of the nitride semiconductor thin films including Mg which is a p-type dopant.

In addition, it is possible for the light emitting diodes and semiconductor lasers that use the nitride semiconductor thin films as the p-type contact layer and current confinement layer, or for the semiconductor lasers that use the nitride semiconductor thin films as the p-type contact layer, optical confinement layer and current confinement layer, to reduce the power consumption in the device operation.

Next, the embodiments in accordance with the present invention will be described in more detail by way of example of GaN-based nitride semiconductors with reference to the accompanying drawings.

EXAMPLE 1

Figure 4A:
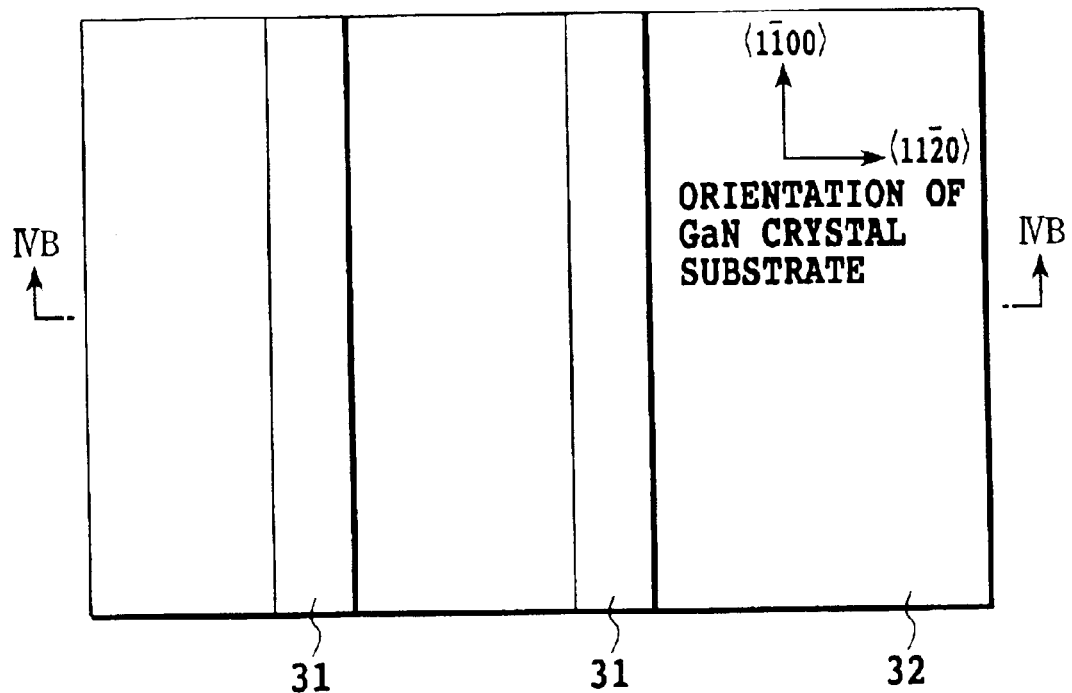
FIG. 4A is a plan view illustrating a process in an example 1, a plan view showing a state in which a masking material with stripe-like openings is formed on the surface of the principal orientation plane (0001) of a GaN crystal substrate.
Figure 4B:
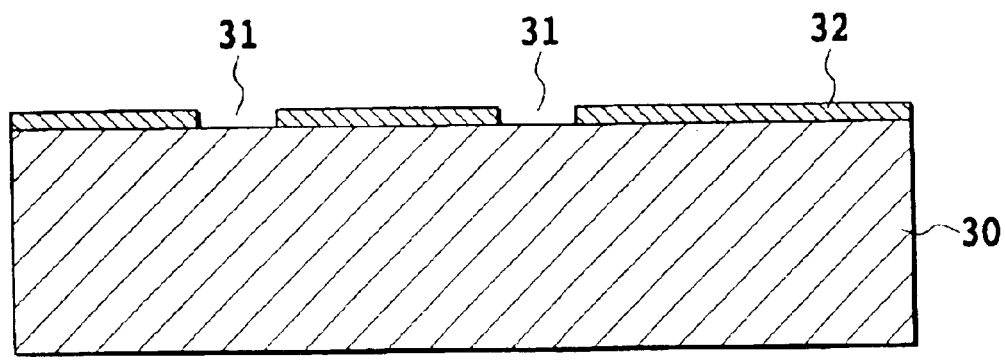
FIG. 4B is a cross-sectional view taken along the line IVB—IVB of FIG. 4A.
Figure 5A:
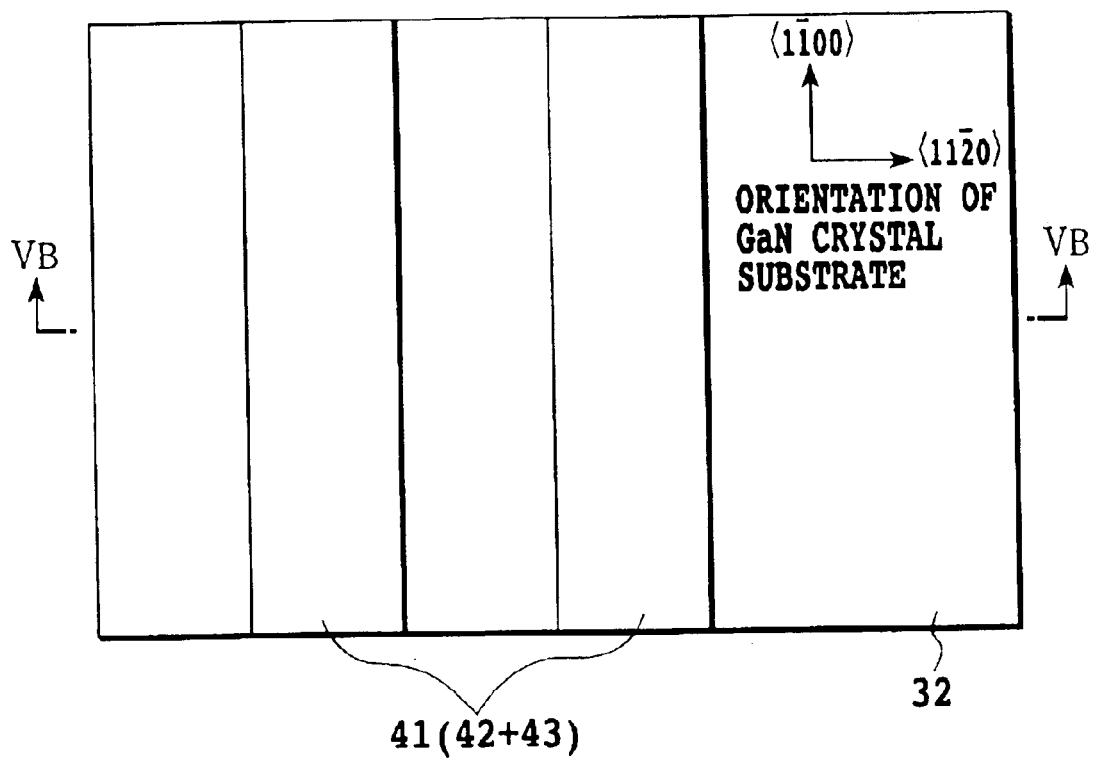
FIG. 5A is a plan view illustrating a process in the example 1, a plan view showing a state in which Mg-doped GaN thin films are formed epitaxially by the selective-area growth on the principal orientation plane (0001) of GaN crystal substrate which is exposed to the inside of openings of a masking material.
Figure 5B:
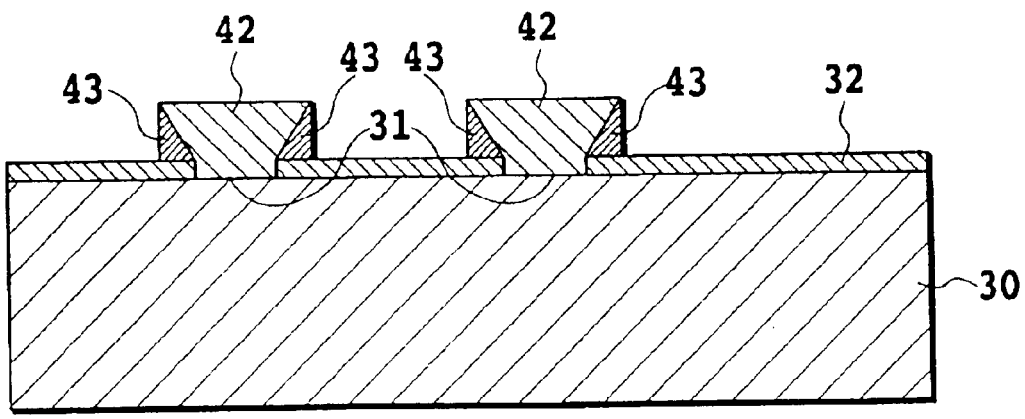
FIG. 5B is a cross-sectional view taken along the line VB—VB of FIG. 5A.

FIGS. 4A, 4B, 5A and 5B are views illustrating a part of a process in the first fabrication example of the nitride semiconductor light emitting device in accordance with the present invention, when forming Mg-doped GaN thin films epitaxially by the selective-area growth using GaN crystal as the substrate: FIGS. 4A and 5A are plan views of the nitride semiconductor light emitting device in accordance with the present invention in the fabrication process; and FIGS. 4B and 5B are cross-sectional views taken along the lines IVB—IVB and VB—VB of FIGS. 4A and 5A, respectively.

FIGS. 4A and 4B illustrate a state in which a masking material 32 with stripe-like openings 31 was formed on the surface of the principal orientation plane (0001) of a GaN crystal substrate. The masking material 32 was composed of silicon dioxide ($SiO_2$) evaporated by a sputtering system. In the present example, the thickness of the masking material 32 was 100 nm. The openings 31 were formed by photolithography and etching using dilute hydrofluoric acid.

As illustrated in FIGS. 4A and 4B, the stripe-like openings 31 are parallel to the <1-100> direction of the GaN crystal substrate 30. The width of the openings 31 can be set in a range from 0.1 μm to 10 mm. In the crystallography, all the directions equivalent to the <1-100> direction are generically denoted as [1-100] direction, which is used throughout the present specification.

The sample as illustrated in FIGS. 4A and 4B was placed in an MOVPE system to grow the Mg-doped GaN thin films epitaxially on the principal orientation plane (0001) of the GaN crystal substrate 30, which was exposed within the openings 31 of the masking material, by the selective-area growth using hydrogen as carrier gas, and using ammonia, trimethylgallium (TMG), and bis-cyclopentadienyl-magnesium ($Cp_2Mg$) which was a magnesium compound as materials.

The flow rates of the hydrogen gas and ammonia gas can each be set in a range from 0.1 to 100 SLM (Standard Liter per Minute). The flow rate of the TMG gas can be set in a range from 0.01 to 10 SCCM (Standard Cubic Centimeter per Minute), and that of the $Cp_2Mg$ gas can be set at about one hundredth of that of the TMG gas. In addition, the substrate temperature can be set in a range from 800 to 1200° C. The thickness of the GaN thin films is made about 0.1–10 μm, which is suitable for the light emitting devices such as the light emitting diodes and semiconductor lasers.

FIGS. 5A and 5B are views illustrating the Mg-doped GaN thin films thus formed by the selective-area growth. The side facets of the Mg-doped GaN thin films 41 were {11-20} facets. Observing a cross-section of the thin films with a scanning electron microscopy (SEM) exhibited a light portion 42 and dark portion 43. The light portion 42 corresponded to the portion formed by the growth of the (0001) plane, whereas the dark portion 43 to the portions formed by the growth of the {11-20} facets.

As described above, the crystal surfaces have a different sticking probability or acquisition efficiency of the dopant Mg depending on the difference between their surface structures. On the other hand, the difference in the brightness of an SEM image results from the difference in the carrier concentrations (hole concentrations in the present example) in the GaN thin films. Thus, the light portion 42 is considered to have a high hole concentration, low resistance and high Mg concentration. In contrast, the dark portion 43 is considered to have a low hole concentration, high resistance and low Mg concentration. In view of this, the relationship between the brightness of the SEM image and the Mg concentration was examined by carrying out cathode luminescence (CL) measurement of the portions 42 and 43.

Figure 6:
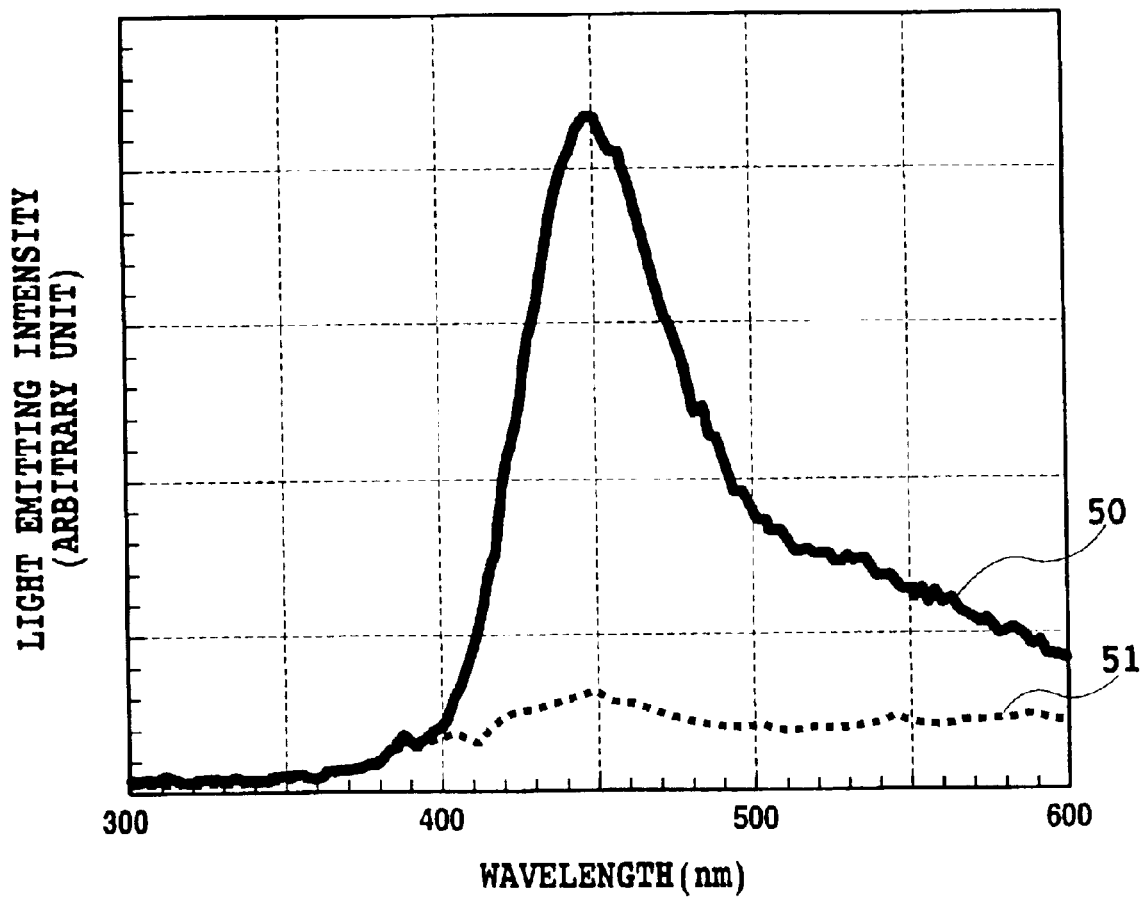
FIG. 6 is a graph illustrating CL spectra of the Mg-doped GaN thin films.

FIG. 6 is a graph illustrating CL spectra obtained from the light portion and dark portion of the SEM image, in which the spectrum 50 is the CL spectrum of the light portion, and the spectrum 51 is the CL spectrum of the dark portion.

As seen from FIG. 6, the CL spectrum 50 of the light portion exhibits blue emission near 450 nm, which is characteristic of the low resistance p-GaN doped with magnesium of a suitable concentration. In contrast, the CL spectrum 51 of the dark portion exhibits a shape characteristic of the high resistance GaN with a very low Mg concentration. In addition, a micro-auger spectroscopy (μ-AES) measurement confirmed that the Mg concentration in the light portion was two or more orders of magnitude higher than that of the dark portion. Consequently, the light portion is considered a high Mg concentration, low resistance p-type region, and the dark portion is considered a low Mg concentration, high resistance region.

Furthermore, it was possible to use such a structure including the p-type low resistance portion and high resistance portion adjacent to each other as a current confinement type p-type contact layer.

EXAMPLE 2

In the present example 2, the stripe-like mask openings 31 of the foregoing example 1 were formed by a crystal growth with setting their directions parallel to the <11-20> direction of the GaN crystal substrate. The remaining process and conditions were identical to those of the example 1. Thus, the side facets of the Mg-doped GaN thin films were {1-100} facets.

The Mg acquisition efficiency of the {1-100} plane of the GaN crystal was two or more orders of magnitude lower than that of the (0001) plane. Accordingly, as in the example 1, the GaN thin films formed by the selective-area growth were composed of the low resistance p-type portion formed as a result of the growth of the (0001) plane and a high resistance portion formed as a result of the growth of the {1-100} facets.

The nitride semiconductor thin films fabricated through the process in the present example 2 can also be used as a current confinement type p-type contact layer.

EXAMPLE 3

Figure 7A:
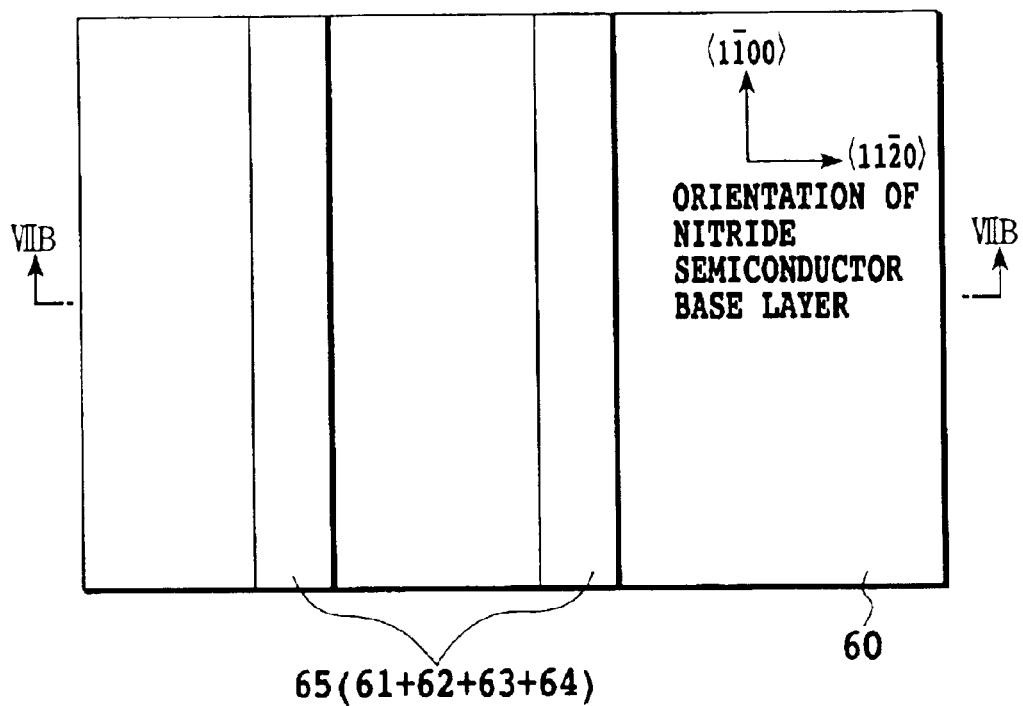
FIG. 7A is a plan view illustrating a process in an example 3, a plan view showing a state in which a nitride semiconductor base layer formed on the principal plane of an n-type SiC (0001) substrate was processed into a stripe-like pattern parallel to its <1-100> direction by ECR dry etching.
Figure 7B:
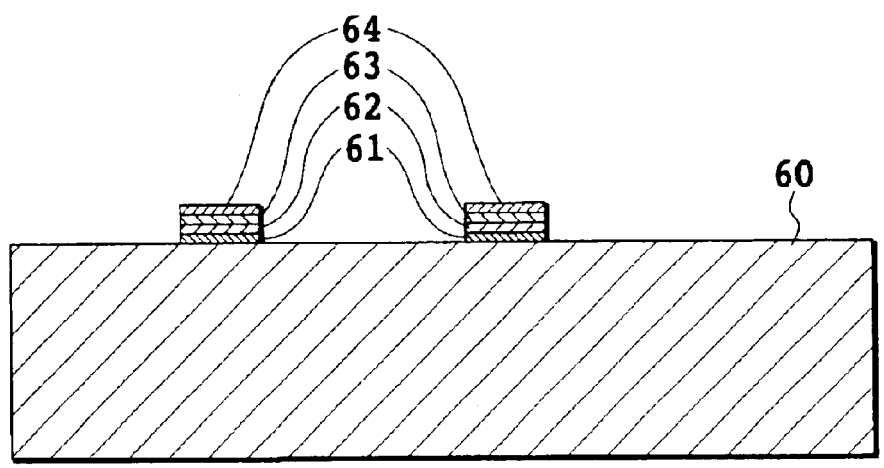
FIG. 7B is a cross-sectional view taken along the line VIIB—VIIB of FIG. 7A.
Figure 8A:
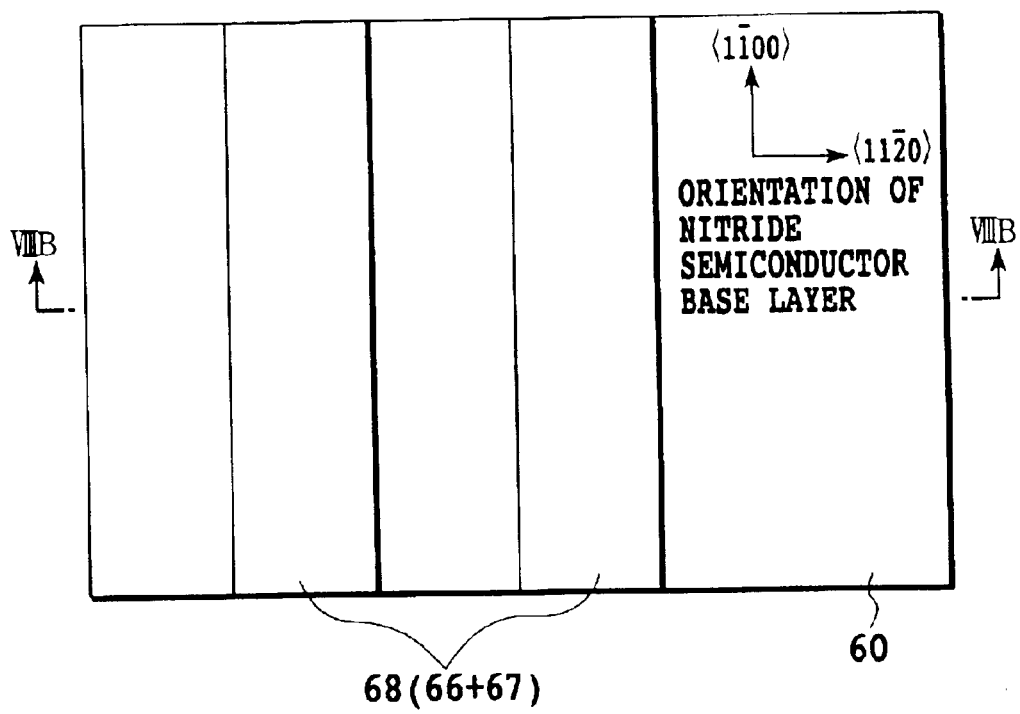
FIG. 8A is a plan view illustrating a process in the example 3, a plan view showing a state in which nitride semiconductor thin films are selectively grown on the top surface and etched side facets of the nitride semiconductor base layer.
Figure 8B:
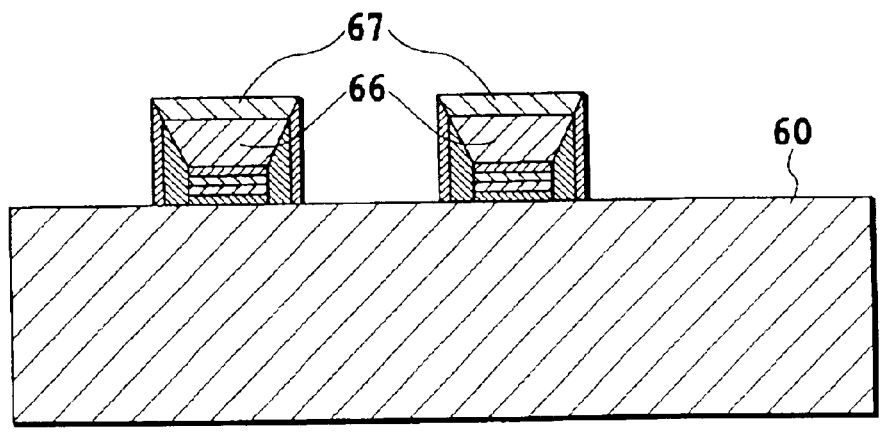
FIG. 8B is a cross-sectional view taken along the line VIIIB—VIIIB of FIG. 8A.

FIGS. 7A and 7B, and 8A and 8B are views illustrating a step of the process of fabricating a second example of the nitride semiconductor light emitting device in accordance with the present invention, which uses an n-type SiC (0001) crystal as a substrate, and includes a p-type AlGaN-based cladding layer and a p-type GaN-based cap layer: FIGS. 7A and 8A are plan views in the process of fabricating the nitride semiconductor light emitting device in accordance with the present invention; and FIGS. 7B and 8B show cross-sections along the lines VIIB—VIIB and VIIIB—VIIIB of FIGS. 7A and 8A, respectively.

FIGS. 7A and 7B are views illustrating a state of a sample after forming thin films of the nitride semiconductor functioning as the base layer of the nitride semiconductor thin films (nitride semiconductor base layer), which will be described later. The nitride semiconductor light emitting device includes a stack of an n-$Al_{0.1}Ga_{0.9}N$ cladding layer 61, n-GaN optical guide layer 62, InGaN MQW active layer 63, and p-GaN optical guide layer 64 sequentially formed on the principal plane of an n-type SiC (0001) substrate 60 by MOVPE using hydrogen as the carrier gas, and ammonia, TMG, trimethylaluminum (TMA), trimethylindium (TMI), silane and $Cp_2Mg$ as the materials. These layers 61, 62, 63 and 64 will be called a nitride semiconductor base layer 65 collectively from now on.

Here, the flow rates of the hydrogen gas and ammonia gas can each be set in the range from 0.1 to 100 SLM, and the flow rate of the TMG gas can be set in the range from 0.01 to 10 SCCM. On the other hand, the flow rates of the TMA, TMI, silane and $Cp_2Mg$ gases can be set at about one tenth, 10 times, one ten thousandth and one hundredth of the flow rate of the TMG gas. As for the substrate temperature, it can be set in the range from 800 to 1200° C. to deposit an n-$Al_{0.1}Ga_{0.9}N$ cladding layer 61, n-GaN optical guide layer 62, and p-GaN optical guide layer 64, and in the range from 600 to 900° C. to deposit the InGaN MQW active layer 63. Incidentally, the 0.5 to 10 μm thick nitride semiconductor base layer 65 is suitable for applying it to light emitting devices such as light emitting diodes and semiconductor lasers.

Subsequently, the nitride semiconductor base layer 65 was processed in a stripe parallel to its <1-100> direction by ECR dry etching. The width of the stripe can be set in the range from 0.1 μm to 10 mm.

FIGS. 8A and 8B are views illustrating a state of a sample after forming a nitride semiconductor thin films, which will be described later. The sample was formed on the nitride semiconductor base layer as shown in FIGS. 7A and 7B by selectively growing a p-$Al_{0.1}Ga_{0.9}N$ cladding layer 66 and p-GaN cap layer 67 on the top surface and etched side facets of the nitride semiconductor base layer 65 by the MOVPE which used the hydrogen gas as the carrier gas, and ammonia, TMG, TMA and $Cp_2Mg$ as the materials. The p-$Al_{0.1}Ga_{0.9}N$ cladding layer 66 and p-GaN cap layer 67 are called nitride semiconductor thin films 68 collectively.

The flow rates of the hydrogen gas and ammonia gas can each be set in the range from 0.1 to 100 SLM, and the flow rate of the TMG gas can be set in the range from 0.01 to 10 SCCM. On the other hand, the flow rates of the TMA and Cp$_2$Mg gases can be set at about one tenth and one hundredth of the flow rate of the TMG gas. The substrate temperature can be set in the range from 800 to 1200° C. The nitride semiconductor thin films 68 of about 0.2 to 5 μm thick is suitable for light emitting devices such as light emitting diodes and semiconductor lasers.

In FIGS. 8A and 8B, the side facets of the nitride semiconductor thin films 68 were {11-20} facets as in the example 1. As for the p-Al$_{0.1}$Ga$_{0.9}$N cladding layer 66 and p-GaN cap layer 67, the Mg acquisition efficiency of their {11-20} planes was two or more orders of magnitude lower than that of the (0001) plane. Consequently, as in the example 1, the nitride semiconductor thin films 68 formed by the selective-area growth were composed of a p-type low resistance portion formed as a result of the growth of the (0001) plane and a high resistance portion formed as a result of the growth of the {11-20} facets.

The nitride semiconductor thin films 68 formed through the process described in the present example were also usable as a current confinement type p-type contact layer. In addition, the sample achieved laser oscillation in a single lateral mode as an index-guided nitride semiconductor laser by forming a cavity by cleaving in the <11-20> direction of the SiC (0001) substrate 60. The laser had its etched side facets of the InGaN MQW active layer 63 covered with the high resistance portion of the p-Al$_{0.1}$Ga$_{0.9}$N cladding layer 66. Thus, it was able to suppress the nonradiative surface recombination of the injected carriers, which was a problem of the conventional nitride semiconductor lasers, thereby reducing the oscillation threshold value.

EXAMPLE 4

In the present example, the nitride semiconductor thin films were formed by processing the nitride semiconductor base layer 65 of the example 3 in stripes parallel to the <11-20> direction rather than to the <1-100> direction by the ECR dry etching. The remaining conditions and processes were identical to those of the example 3 so that the side facets of the nitride semiconductor thin films were made {1-100} facets.

As for the p-Al$_{0.1}$Ga$_{0.9}$N layer and p-GaN layer, the Mg acquisition efficiency of their {1-100} facets was two or more orders of magnitude lower than that of the (0001) plane. Consequently, as in the example 3, the nitride semiconductor thin films formed by the selective-area growth were composed of a p-type low resistance portion formed as a result of the growth of the (0001) plane and a high resistance portion formed as a result of the growth of the {1-100} facets.

The nitride semiconductor thin films formed through the process described in the present example were also usable as a current confinement type p-type contact layer. In addition, it was confirmed that the sample achieved laser oscillation in a single lateral mode as an index-guided nitride semiconductor laser by forming a cavity by cleaving in the <1-100> direction of the SiC (0001) substrate. In this case also, the laser was able to suppress the nonradiative surface recombination of the injected carriers, which was a problem of the conventional nitride semiconductor lasers, thereby reducing the oscillation threshold value.

EXAMPLE 5

Figure 9A:
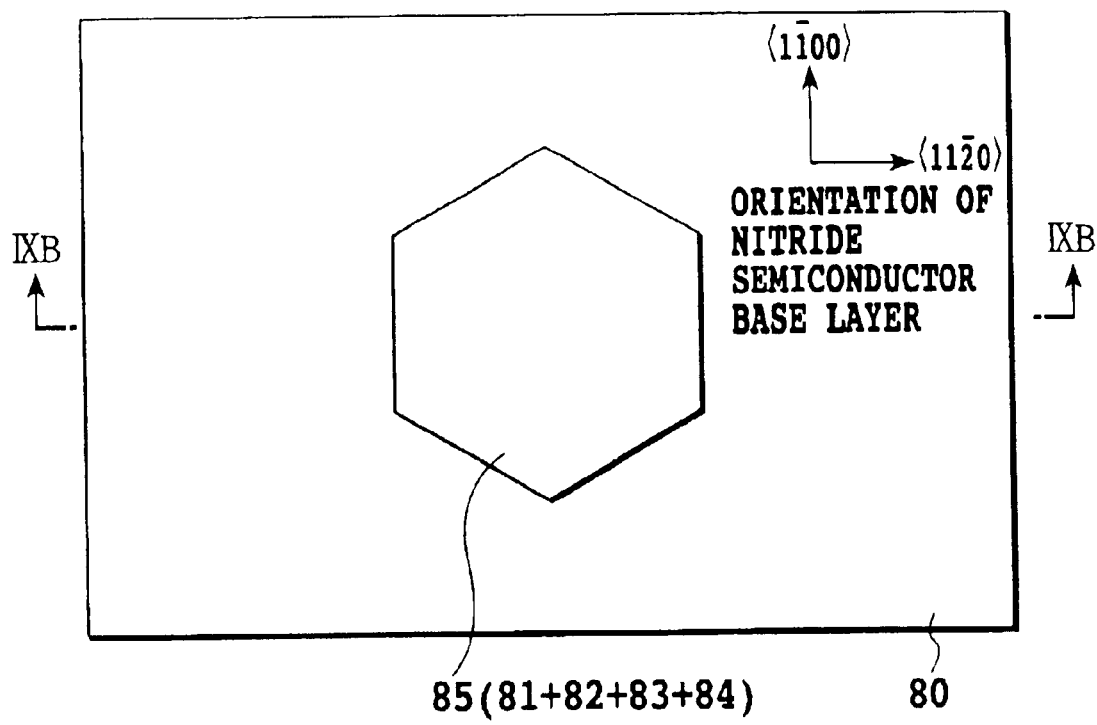
FIG. 9A is a plan view illustrating a process in an example 5, a plan view showing a state in which a nitride semiconductor base layer is formed on the principal plane of an n-type SiC (0001) substrate, followed by processing it into a regular hexagon whose sides are parallel to the [1-100] direction of the nitride semiconductor base layer by ECR dry etching.
Figure 9B:
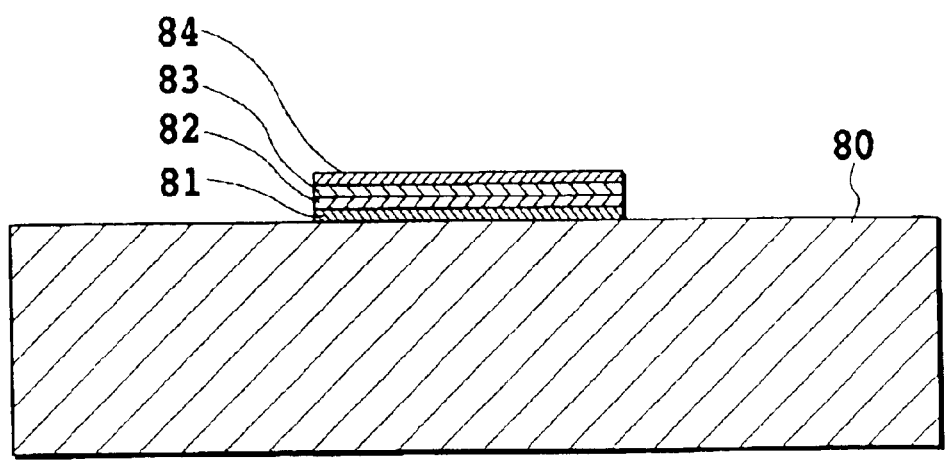
FIG. 9B is a cross-sectional view taken along the line IXB—IXB of FIG. 9A.
Figure 10A:
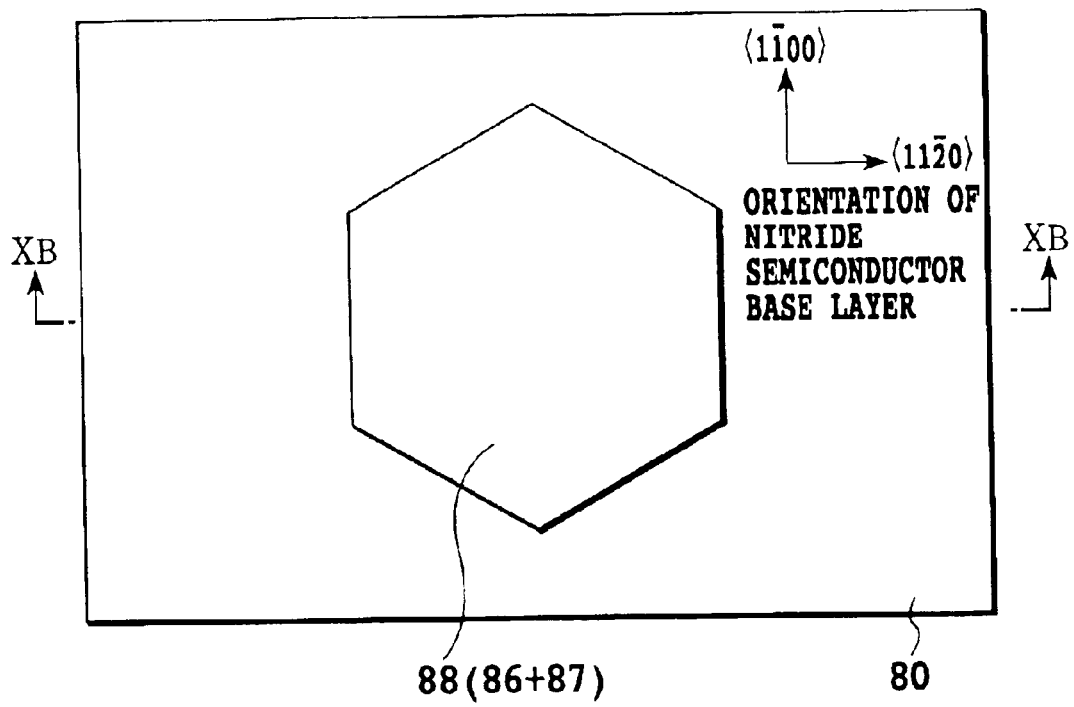
FIG. 10A is a plan view illustrating a process in the example 5, a plan view showing a state in which nitride semiconductor thin films are selectively grown on the top surface and etched side facets of the nitride semiconductor base layer.
Figure 10B:
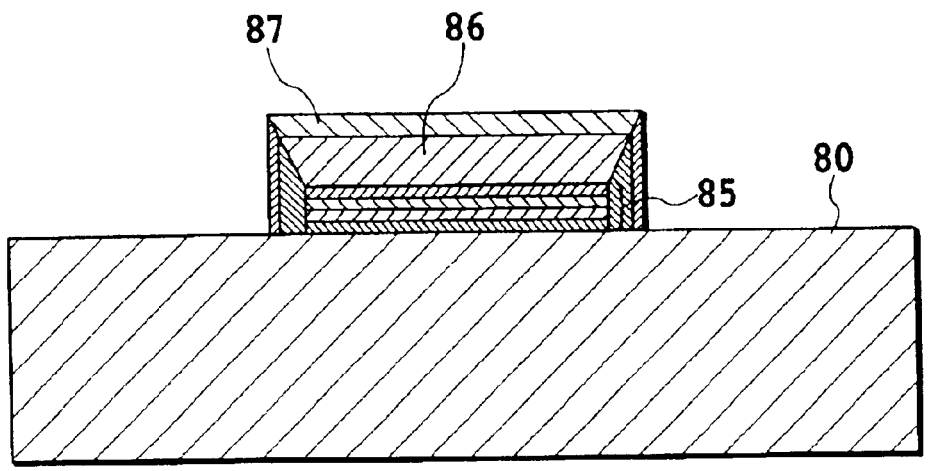
FIG. 10B is a cross-sectional view taken along the line XB—XB of FIG. 10A.

FIGS. 9A and 9B, and 10A and 10B are views illustrating a step of the process of a fabricating example of the nitride semiconductor light emitting device in accordance with the present invention, which uses an n-type SiC (0001) crystal as a substrate, and includes a p-type AlGaN-based cladding layer and a p-GaN cap layer: FIGS. 9A and 10A are plan views in the process of fabricating the nitride semiconductor light emitting device in accordance with the present invention; and FIGS. 9B and 10B show cross-sections along the lines IXB—IXB and XB—XB of FIGS. 9A and 10A, respectively.

FIGS. 9A and 9B are views illustrating a state of a sample after forming thin films of the nitride semiconductor functioning as the base layer of the nitride semiconductor thin films (nitride semiconductor base layer), which will be described later. The nitride semiconductor light emitting device includes as a nitride semiconductor base layer 85 a stack of an n-Al$_{0.1}$Ga$_{0.9}$N cladding layer 81, n-GaN optical guide layer 82, InGaN MQW active layer 83, and p-GaN optical guide layer 84 sequentially formed on the principal plane of an n-type SiC (0001) substrate 80 by MOVPE using hydrogen as the carrier gas, and ammonia, TMG, TMA, TMI, silane and Cp$_2$Mg as the materials. Here, the supply amounts of the gases and the substrate temperature were identical to those of the example 3. Besides, the thickness of the nitride semiconductor base layer 85 was identical to that of the example 3.

Subsequently, the nitride semiconductor base layer 85 was processed into a regular hexagon with its sides being parallel to the [1-100] direction of the nitride semiconductor base layer 85 by the ECR dry etching. The length of the side of the regular hexagon can be set in the range from 0.1 μm to 10 mm.

FIGS. 10A and 10B are views illustrating a state of the sample after forming nitride semiconductor thin films, which will be described later. The sample was formed on the nitride semiconductor base layer as shown in FIGS. 9A and 9B by selectively growing nitride semiconductor thin films 88 composed of a p-Al$_{0.1}$Ga$_{0.9}$N cladding layer 86 and p-GaN cap layer 87 on the top surface and etched side facets of the nitride semiconductor base layer 85 by the MOVPE which uses ammonia, TMG, TMA and Cp$_2$Mg as the materials. The supply amounts of the gases and the substrate temperature were identical to those of the example 3. Besides, the thickness of the nitride semiconductor base layer 88 was identical to that of the example 3.

The side facets of the nitride semiconductor thin films 88 were {11-20} facets as in the example 3. In addition, the nitride semiconductor thin films 88 formed by the selective-area growth were composed of a p-type low resistance portion formed as a result of the growth of the (0001) plane and a high resistance portion formed as a result of the growth of the {11-20} facets.

The nitride semiconductor thin films 88 formed through the process described in the present example were also usable as the current confinement type p-type contact layer. In addition, they achieved laser oscillation in a single lateral mode as a nitride semiconductor laser with a ring cavity.

As described above, according to the present invention, the masking material, which includes the stripe-like openings parallel to the [1-100] direction of the nitride semiconductor thin films, was formed on the principal plane of the substrate, and then the nitride semiconductor thin films were formed by the selective-area growth in the openings in the masking material, which was formed on the principal plane of the substrate, with doping Mg by the vapor phase growth using the metallic magnesium or Mg compound as one of the materials. Thus, the resultant nitride semiconductor thin films were composed of the p-type low resistance portion formed as a result of the growth of the (0001) plane and the high resistance portion formed as a result of the growth of the {11–2x} facets (x=0, 1, 2). Consequently, it can implement the p-type contact layer serving as the current confinement layer, thereby being able to increase the area of the p-type electrode as compared with the conventional examples, and to reduce the loss of the power due to the contact resistance.

In addition, according to the present invention, the nitride semiconductor base layer whose principal plane was the (0001) plane was formed on the substrate, and then processed into stripes parallel to the [1-100] direction by etching, followed by forming the nitride semiconductor thin films by the selective-area growth on the (0001) plane, which was the principal plane of the nitride semiconductor base layer processed into stripes, and on the etched side facets, with doping Mg by the vapor phase growth using the metallic magnesium or Mg compound as one of the materials. Thus, the resultant nitride semiconductor thin films are composed of the p-type low resistance portion formed as a result of the growth of the (0001) plane and the high resistance portion formed as a result of the growth of the {11–2x} facets (x=0, 1, 2). Consequently, it can implement the p-type contact layer serving as the current confinement layer, thereby being able to increase the area of the p-type electrode as compared with the conventional examples, and to reduce the loss of the power due to the contact resistance. Furthermore, since the nitride semiconductor thin films are usable as the cladding layer of the index-guided nitride semiconductor laser without change, they can suppress the nonradiative surface recombination of the injected carriers, and reduce the oscillation threshold value of the laser.

Incidentally, the present invention has some variations. For example, the stripe-like openings of the masking material or the nitride semiconductor base layer processed in the stripes can achieve the same advantages, even if their directions are set in the [11-20] direction instead of the [1-100] direction.

In addition, the shape of the openings in the masking material or the shape to which the nitride semiconductor base layer is processed may be a polygon whose sides have the [1-100] or [11-20] direction instead of stripe, with achieving the same advantages.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A thin film deposition method of forming thin films on a substrate by selective-area growth of a nitride semiconductor whose principal orientation plane is a (0001) plane, said thin film deposition method comprising the steps of:

forming on a principal orientation plane of said substrate a masking material including stripe-like openings parallel to a [1-100] direction of a nitride semiconductor to be grown by selective-area growth, or polygon-like openings whose side is parallel to a [1-100] direction of a nitride semiconductor thin film to be grown by selective-area growth, to expose part of the principal orientation plane of said substrate;

growing nitride semiconductor thin films on the opening region by selective-area growth by vapor phase growth using a gas containing a metallic magnesium or a magnesium compound, said nitride semiconductor thin films including a first nitride semiconductor crystal portion formed as a result of growth in the direction perpendicular to the (0001) principal plane and a second nitride semiconductor crystal portion formed as a result of growth of {11–2x} (x=0, 1, 2) facets; and making Mg concentration of said second nitride semiconductor crystal portion lower than that of said first nitride semiconductor crystal portion.

2. The thin film deposition method as claimed in claim 1, wherein said nitride semiconductor includes any one of BN, GaN, AlGaN, InGaN and AlInGaN.

3. The thin film deposition method as claimed in claim 1, wherein said substrate includes any one of BN, GaN, AlGaN, InGaN, AlInGaN, sapphire, SiC, Si and GaAs.

4. A nitride semiconductor light emitting device comprising a p-type electrode and a p-type contact layer, wherein said p-type contact layer consists of a current confinement type p-type contact layer including nitride semiconductor thin films formed by the thin film deposition method of the nitride semiconductor as defined in claim 1.

5. An index-guided nitride semiconductor laser comprising a p-type electrode, a p-type contact layer, and a cladding layer, wherein said p-type contact layer and said cladding layer each include nitride semiconductor thin films formed by the thin film deposition method of the nitride semiconductor as defined in claim 1; and said p-type contact layer is a current confinement type p-type contact layer.

6. A thin film deposition method of forming thin films on a substrate by selective-area growth of a nitride semiconductor whose principal orientation plane is a (0001) plane, said thin film deposition method comprising the steps of:

forming on a principal orientation plane of said substrate a masking material including stripe-like openings parallel to a [11-20] direction of a nitride semiconductor to be grown by selective-area growth, or polygon-like openings whose side is parallel to a [11-20] direction of a nitride semiconductor thin film to be grown by selective-area growth, to expose part of the principal orientation plane of said substrate;

growing nitride semiconductor thin films on the opening region by selective-area growth by vapor phase growth using a gas containing a metallic magnesium or a magnesium compound, said nitride semiconductor thin films including a first nitride semiconductor crystal portion formed as a result of growth in the direction perpendicular to the (0001) principal plane and a second nitride semiconductor crystal portion formed as a result of growth of {1–10x} (x=0, 1) facets; and making Mg concentration of said second nitride semiconductor crystal portion lower than that of said first nitride semiconductor crystal portion.

7. The thin film deposition method as claimed in claim 6, wherein said nitride semiconductor includes any one of BN, GaN, AlGaN, InGaN and AlInGaN.

8. The thin film deposition method as claimed in claim 6, wherein said substrate includes any one of BN, GaN, AlGaN, InGaN, AlInGaN, sapphire, SiC, Si and GaAs.

9. A nitride semiconductor light emitting device comprising a p-type electrode and a p-type contact layer, wherein said p-type contact layer consists of a current confinement type p-type contact layer including nitride semiconductor thin films formed by the thin film deposition method of the nitride semiconductor as defined in claim 6.

10. An index-guided nitride semiconductor laser comprising a p-type electrode, a p-type contact layer, and a cladding layer, wherein
said p-type contact layer and said cladding layer each include nitride semiconductor thin films formed by the thin film deposition method of the nitride semiconductor as defined in claim 6; and
said p-type contact layer is a current confinement type p-type contact layer.

11. A thin film deposition method of forming thin films on a substrate by selective-area growth of a nitride semiconductor whose principal orientation plane is a (0001) plane, said thin film deposition method comprising the steps of:
forming on a principal orientation plane of said substrate a stripe-like nitride semiconductor base layer that is parallel to a [1-100] direction of a nitride semiconductor to be grown by selective-area growth and has a (0001) plane as a principal orientation plane, or a polygon-like nitride semiconductor base layer whose side is parallel to a [1-100] direction of nitride semiconductors to be grown by selective-area growth and which has a (0001) plane as a principal orientation plane;
growing nitride semiconductor thin films on the principal orientation plane and side facets of said nitride semiconductor base layer by selective-area growth by vapor phase growth using a gas containing a metallic magnesium or a magnesium compound, said nitride semiconductor thin films including a first nitride semiconductor crystal portion formed as a result of growth in the direction perpendicular to the (0001) principal plane and a second nitride semiconductor crystal portion formed as a result of growth of $\{11–2x\}$ (x=0, 1, 2) facets; and
making Mg concentration of said second nitride semiconductor crystal portion lower than that of said first nitride semiconductor crystal portion.

12. The thin film deposition method as claimed in claim 11, wherein said nitride semiconductor includes of any one of BN, GaN, AlGaN, InGaN and AlInGaN.

13. The thin film deposition method as claimed in claim 11, wherein said substrate includes any one of BN, GaN, AlGaN, InGaN, AlInGaN, sapphire, SiC, Si and GaAs.

14. A nitride semiconductor light emitting device comprising a p-type electrode and a p-type contact layer, wherein
said p-type contact layer includes a current confinement type p-type contact layer composed of nitride semiconductor thin films formed by the thin film deposition method of the nitride semiconductor as defined in claim 11.

15. An index-guided nitride semiconductor laser comprising a p-type electrode, a p-type contact layer, and a cladding layer, wherein
said p-type contact layer and said cladding layer each include nitride semiconductor thin films formed by the thin film deposition method of the nitride semiconductor as defined in claim 11; and
said p-type contact layer is a current confinement type p-type contact layer.

16. A thin film deposition method of forming thin films on a substrate by selective-area growth of a nitride semiconductor whose principal orientation plane is a (0001) plane, said thin film deposition method comprising the steps of:
forming on a principal orientation plane of said substrate a stripe-like nitride semiconductor base layer that is parallel to a [11-20] direction of a nitride semiconductor to be grown by selective-area growth and has a (0001) plane as a principal orientation plane, or a polygon-like nitride semiconductor base layer whose side is parallel to a [11-20] direction of a nitride semiconductor to be grown by selective-area growth and which has a (0001) plane as a principal orientation plane;
growing nitride semiconductor thin films on the principal orientation plane and side facets of said nitride semiconductor base layer by selective-area growth by vapor phase growth using a gas containing a metallic magnesium or a magnesium compound, said nitride semiconductor thin films including a first nitride semiconductor crystal portion formed as a result of growth in the direction perpendicular to the (0001) principal plane and a second nitride semiconductor crystal portion formed as a result of growth of $\{1–10x\}$ (x=0, 1) facets; and
making Mg concentration of said second nitride semiconductor crystal portion lower than that of said first nitride semiconductor crystal portion.

17. The thin film deposition method as claimed in claim 16, wherein said nitride semiconductor includes any one of BN, GaN, AlGaN, InGaN and AlInGaN.

18. The thin film deposition method as claimed in claim 16, wherein said substrate includes any one of BN, GaN, AlGaN, InGaN, AlInGaN, sapphire, SiC, Si and GaAs.

19. A nitride semiconductor light emitting device comprising a p-type electrode and a p-type contact layer, wherein
said p-type contact layer includes a current confinement type p-type contact layer composed of nitride semiconductor thin films formed by the thin film deposition method of the nitride semiconductor as defined in claim 16.

20. An index-guided nitride semiconductor laser comprising a p-type electrode, a p-type contact layer, and a cladding layer, wherein
said p-type contact layer and said cladding layer each include nitride semiconductor thin films formed by the thin film deposition method of the nitride semiconductor as defined in claim 16; and
said p-type contact layer is a current confinement type p-type contact layer.

* * * * *

UNITED STATES PATENT AND TRADEMARK OFFICE
CERTIFICATE OF CORRECTION

PATENT NO. : 6,920,166 B2
APPLICATION NO. : 10/390358
DATED : July 19, 2005
INVENTOR(S) : Akasaka et al.

It is certified that error appears in the above-identified patent and that said Letters Patent is hereby corrected as shown below:

Column 6,
Line 64, after "p-type electrode" insert --more--.

Column 7,
Line 17, change "As" to --For--.

Column 8
Line 39, change "substrate:" to --substrate;--.

Column 9,
Line 6, change "one hundredth" to --one one hundredth--.
Line 60, before "setting" change "with" to --by--.

Column 10,
Line 16, change "layer:" to --layer;--
Line 41, change "one hundredth" to --one one hundredth--

Column 12,
Line 4, change "layer:" to --layer;--

Column 13,
Line 18, before "doping" change "with" to --by--.
Line 18, before "vapor" remove "the".
Line 43, change "stripe," to --stripes,--.
Line 43, change "with" to --while still--.

Signed and Sealed this

Eleventh Day of July, 2006

JON W. DUDAS
*Director of the United States Patent and Trademark Office*